(12) United States Patent
Stevens

(10) Patent No.: US 6,649,442 B2
(45) Date of Patent: Nov. 18, 2003

(54) FAST LINE DUMP STRUCTURE FOR SOLID STATE IMAGE SENSOR

(75) Inventor: Eric G. Stevens, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/293,672

(22) Filed: Nov. 13, 2002

(65) Prior Publication Data

US 2003/0067019 A1 Apr. 10, 2003

Related U.S. Application Data

(62) Division of application No. 09/533,050, filed on Mar. 22, 2000, now Pat. No. 6,507,056.

(51) Int. Cl.[7] .................... H01L 21/00; H01L 21/339
(52) U.S. Cl. ............................... 438/75; 438/147
(58) Field of Search ..................... 438/75, 144, 145, 438/146, 147, 148

(56) References Cited

U.S. PATENT DOCUMENTS

| | | | |
|---|---|---|---|
| 4,040,076 A | 8/1977 | Kosonocky et al. | 257/223 |
| 4,611,140 A | 9/1986 | Whitlock et al. | 310/313 B |
| 5,121,214 A | 6/1992 | Turko et al. | 358/213.19 |
| 5,283,450 A * | 2/1994 | Harada | 257/223 |
| 5,343,297 A | 8/1994 | Tiemann et al. | 348/301 |
| 5,355,165 A | 10/1994 | Kosonocky et al. | 348/311 |
| 5,440,343 A | 8/1995 | Parulski et al. | 348/316 |
| 5,614,740 A | 3/1997 | Gardner et al. | 257/222 |
| 5,668,597 A | 9/1997 | Parulski et al. | 348/350 |
| 5,796,432 A | 8/1998 | Iesaka et al. | 257/223 |

* cited by examiner

*Primary Examiner*—John F. Niebling
*Assistant Examiner*—Viktor Simkovic
(74) *Attorney, Agent, or Firm*—Peyton C. Watkins

(57) ABSTRACT

The present invention is a structure for a fast-dump gate (FDG) and a fast-dump drain (FDD) for a charge coupled device. It is envisioned that the charge coupled device be a horizontal readout register of a solid-state image sensor. This structure uses a third layer of polysilicon (or other suitable gate material) to form the fast-dump gate which is in addition to the other two layers of gate material used to form the gates in the horizontal readout register. This allows the channel region under the fast-dump gate (FDG) to form without the use of highly-doped channel stop regions thereby eliminating any potential wells or barriers that may result in transfer inefficiency often time found with other structures.

11 Claims, 4 Drawing Sheets

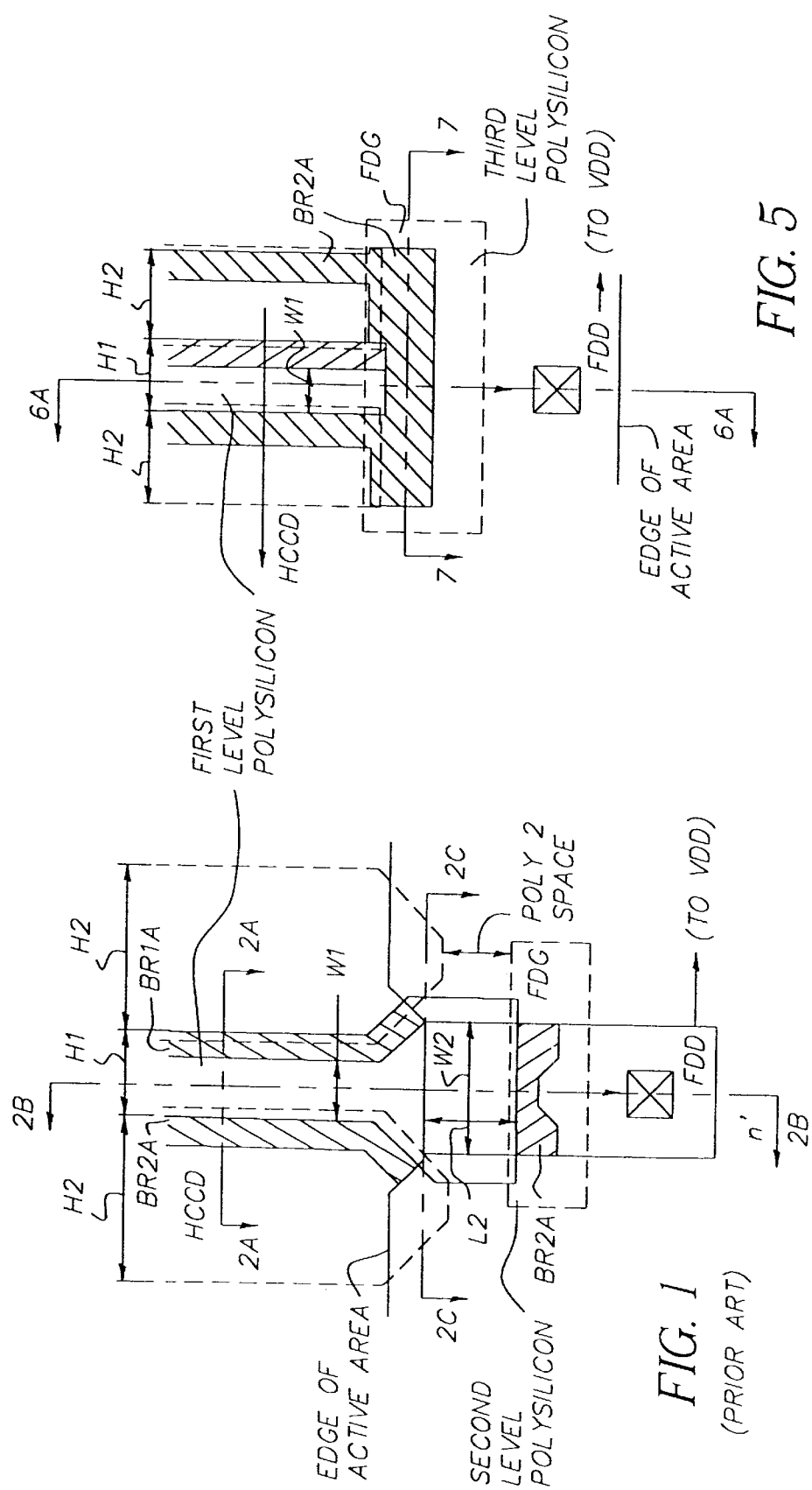

FAST LINE DUMP STRUCTURE FOR SOLID STATE IMAGE SENSOR

CROSS-REFERENCE TO RELATED APPLICATIONS

This is a division of application Ser. No. U.S. 09/533,050, filed Mar. 22, 2000, now U.S. Pat. No. 6,507,056 which is also related to U.S. application Ser. No. 09/533,051, filed Mar. 22, 2000, by Eric G. Stevens and William F. DesJardin, and entiled "FAST-DUMP STRUCTURE FOR FULL-FRAME IMAGE SENSORS WITH LOD ANTIBLOOMING STRUCTURES".

FIELD OF THE INVENTION

This invention relates to charge coupled devices, and more particularly to fast-dump gate formed within charge coupled devices.

BACKGROUND OF THE INVENTION

The charge coupled device (CCD) art is replete with teachings for selectively removing charges in a predetermined manner. Fast-dump gates are typically used within prior art devices in the area of a horizontal CCD (HCCD) shift register to: (1) read out data from the horizontal CCD; or (2) selectively dump lines of data from the horizontal shift register in sub-sampling modes.

A conventional prior art device employing fast-dump gate structure is shown in FIG. 1 with two levels of polysilicon used to form the CCD electrodes. The two levels of polysilicon are indicated as H1 for the first level of polysilicon and H2 for the second level of polysilicon. Boron implants are used to form the two-phase CCD barrier regions in FIG. 1 and are indicated as BR1A for H1 and BR2A for H2. Each of the H1, H2 electrodes has an n-type buried channel beneath the poly1, poly2 electrodes in the prior art device shown in FIG. 1. The problem with these prior art devices is that CCD cell of the horizontal shift register which is to be connected to the fast-dump gate (shown as H1) has an effective width W2 that increases as the H1 cell of the horizontal shift register approaches the FDG along the length L2, yielding a well. Other prior art devices have an effective width W2 that decreases as it approaches the FDG along the length L2 creating a barrier.

FIG. 2a is a cross sectional view of FIG. 1 along the line AA with associated potential diagrams 2b and 2c for cases where the effective channel width decreases as it approaches the fast-dump gate and the effective channel width increases as it approaches the fast-dump gate. The actual width W2 is drawn larger than W1 to compensate for the encroachment of an implanted boron channel stop so that $W2_{eff}=W1_{eff}$. However, if $W2_{eff}>W1_{eff}$, a well is formed which is illustrated in FIG. 2c, and if $W2_{eff}<W1_{eff}$, a barrier is formed which is illustrated in FIG. 2b. The length L2 is a requirement that is dictated and determined by two level polysilicon space design rules to prevent H2 and FDG from shorting together. When $W2_{eff}<W1_{eff}$, a barrier exists which inhibits charge flow into FDD during fast-dump operation as shown in FIG. 2b. When $W2_{eff}>W1_{eff}$, no barrier exists in "L2" region and fast-dump operation works fine, but when FDG is off, a potential well exists in this region which can trap charge during HCCD readout as shown in FIG. 2c.

FIG. 2d is a diagram illustrating the narrow width effect that is cured by the present invention. As the width increases, the potential shown as φ (v) increases and then eventually flattens out.

Referring to FIG. 3, which is a cross sectional view of FIG. 1 along the line BB parallel to and through HCCD showing width W1. The two levels of polysilicon are indicated as poly1 and poly2 for H1 and H2, respectively. The boron implants that form the barrier regions are indicated as BR1A for H1 and BR2A for H2. Each of the H1, H2 electrodes has an n-type buried channel beneath the poly1 poly2 electrodes.

Referring to FIG. 4, which is a cross-sectional view of FIG. 1 through the line CC and parallel to HCCD through the bottom part of H1 showing second width, W2. The boron implants resulting in p+ channel stops are illustrated as the identifying feature for W2. The p+ channel stops and Local Oxidized Silicon (LOCOS) provide channel isolation. FIG. 4 taken in conjunction with FIG. 1, illustrates that the width W2 increases to compensate for the narrowing effect of the boron implants used to create channel stops, resulting in the barriers and wells as previously discussed.

It should be readily apparent from the foregoing discussion that there remains a need within the art for a fast-dump gate structure that does not have the likelihood of creating barriers and wells that exist with currently available devices.

SUMMARY OF THE INVENTION

The present invention solves many of the aforementioned problems within the prior art by providing a structure that comprises a fast-dump gate (FDG) and a fast-dump drain (FDD) that is connected to a horizontal readout register of a solid-state image sensor. Selectively, lines of the captured image (in the form of charge in the readout register) may be cleared or dumped into the FDD through the channel region below the FDG. This feature can be used, for example, to subsample the image or to read a frame out more quickly by throwing away selected lines. This structure uses a third layer of polysilicon (or other suitable gate material) to form the fast-dump gate which is in addition to the other two layers of gate material used to form the gates in the horizontal readout register. This allows the channel region under the FDG to form without the use of highly doped channel stop regions thereby eliminating the narrow-channel effect and any potential wells or barriers that may result in transfer inefficiency often times found with other structures.

Accordingly the present invention provides a solution to the problems within the prior art by providing a charge coupled device having a fast-dump gate (FDG) and a fast-dump drain (FDD) comprising: a charge coupled device having a first and a second level of polysilicon layers used to form electrodes on the charge coupled device; a third level polysilicon layer used to formed the fast-dump gate adjacent to at least one of the cells of the charge coupled device; and a drain that forms the fast-dump drain being operatively connected to the fast-dump gate.

ADVANTAGEOUS EFFECT OF THE INVENTION

The invention advantages of not creating potential wells and barriers within fast-dump gate structures.

BRIEF DESCRIPTION OF THE DRAWINGS

FIG. 1 is a top view of a prior art fast-dump gate device illustrating the change in the channel width typically associated with prior art fast-dump gates;

FIG. 5 is a top view of the present invention illustrating the channel width within the fast-dump gate area;

DETAILED DESCRIPTION OF THE INVENTION

Referring to FIG. 5, which illustrates a fast-dump structure on a charge-coupled device (CCD) as envisioned by the present invention wherein the fast-dump gate (FDG) is fabricated by use of a third level polysilicon. Comparing the present invention as seen in FIG. 5 with the prior art device shown in FIG. 1, the present invention employs a third level of polysilicon which allows the FDG to be placed directly against the electrodes into the horizontal shift register area where the width is still W1, thereby, not incurring the potential barriers or wells that occur with increasing width W2 within the length L2 that are found in the prior art devices such as those shown in FIG. 1. The reasons for this is that the length L2 has been eliminated The fast-dump gate is an area within a charge-coupled device for removing charge from the charge-coupled device to a drain area. The present invention envisions employing a series of first level and second level polysilicon electrodes H1, H2 used within a horizontal charge-coupled device (HCCD) to form a two-phase device in a manner as shown in the prior art device of FIG. 1. However, the present invention envisions that the fast-dump gate be connected to the selected cells within the HCCD via implementation of a third level polysilicon such that the third level polysilicon can overlap the first and second levels of polysilicon electrodes H1, H2 without shorting them together. A drain is formed on the opposite side of the fast-dump gate that functions as the output node for charges that are to be dumped from the HCCD via the fast-dump gate connection.

Figure 2A:
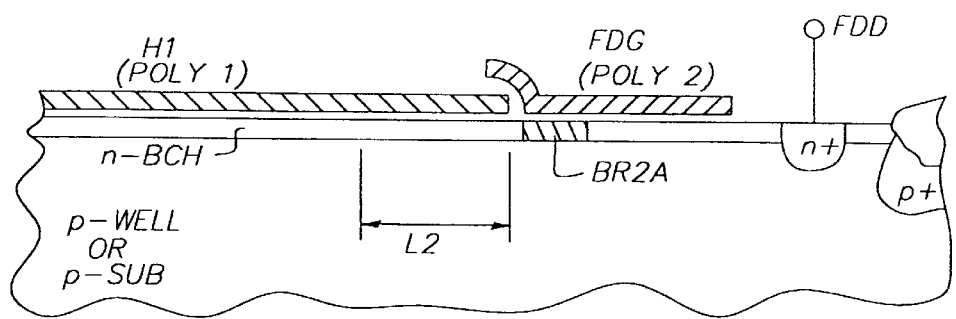
FIG. 2a is a cross-sectional view of FIG. 1 along the line AA.
Figure 2B:
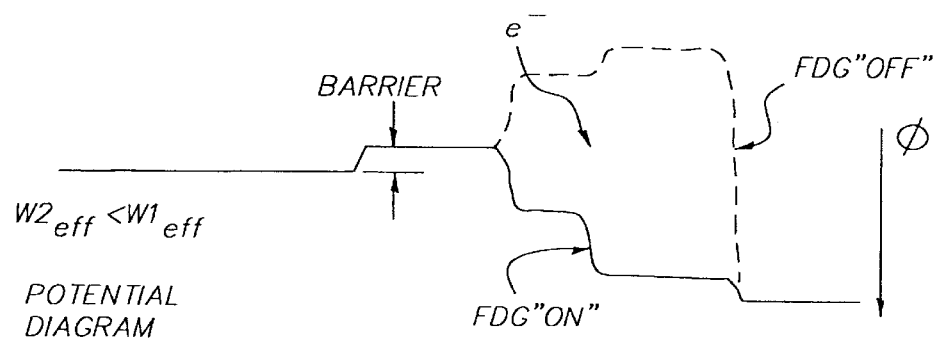
FIG. 2b is the associated potential diagram for FIG. 2a in the case where channel width decreases as it approaches the fast-dump gate.
Figure 2C:
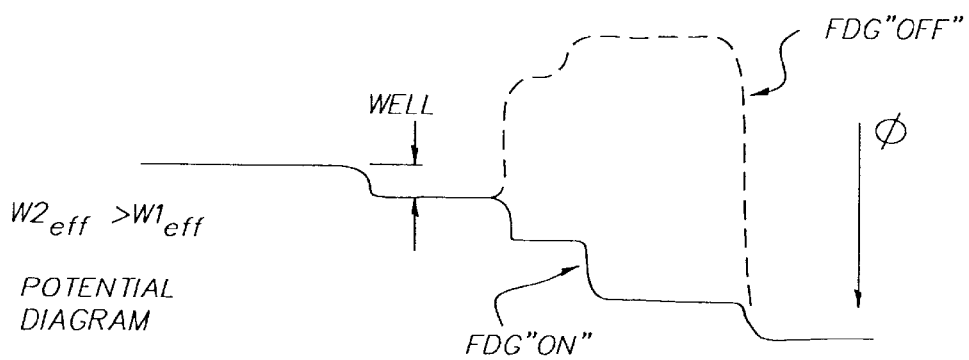
FIG. 2c is a diagram of the associated potential diagrams for FIG. 2a in the case where channel width increases as it approaches the fast-dump gate.
Figure 2D:
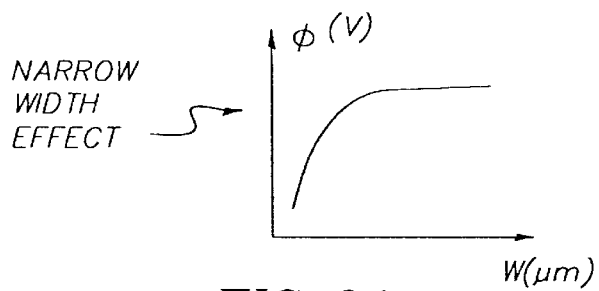
FIG. 2d is a potential diagram illustrating the narrow width effects.
Figure 3:
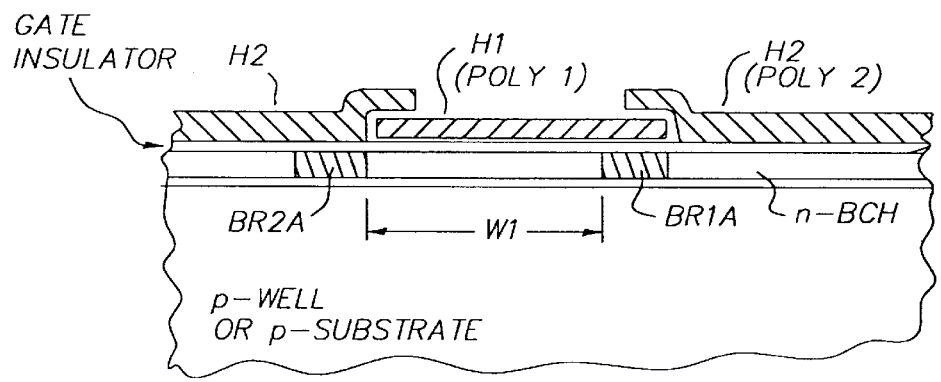
FIG. 3 is a cross-sectional view of FIG. 1 along the line BB.

Prior art, fast-dump gates are typically used in the area of a horizontal CCD shift register to: (1) read out selected data from the horizontal CCD in a windowing function; or (2) selectively dump lines of data from the horizontal shift register in sub-sampling modes. Prior art devices employ structures as shown in FIG. 1 with two levels of polysilicon to create the electrodes within the horizontal CCD. FIG. 2a is a cross sectional view of FIG. 1 along the line AA with associated potential diagrams for cases where the effective channel width decreases as it approaches the fast-dump gate and the effective channel width increases as it approaches the fast-dump gate. The problem with these prior art devices is that as the effective W2 increases, or decreases, the horizontal shift register approaches the fast-dump gate (FDG) yielding in many cases either a barrier (FIG. 2b) or a well (FIG. 2c) along the length L2.

Figure 4:
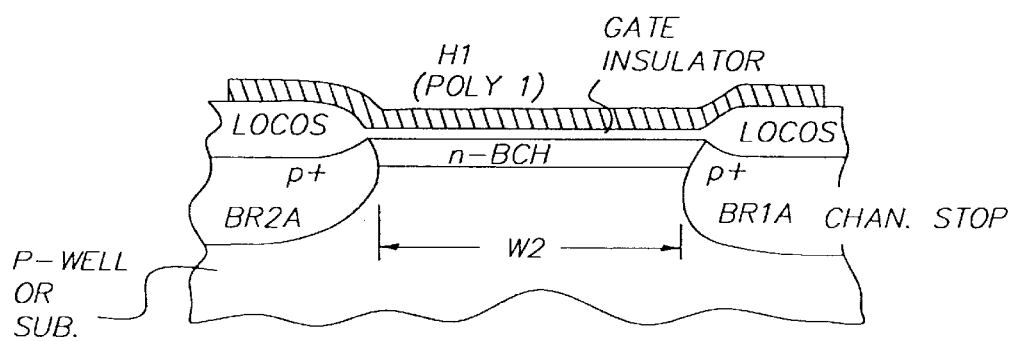
FIG. 4 is a cross-sectional view of FIG. 1 along the line CC.

Referring to FIG. 4, which is a cross-sectional view of FIG. 1 through the line CC and parallel to HCCD through bottom part of H1 showing second width, W2. The boron implants resulting in p+ channel stops are illustrated as the identifying features for W2. The p+ channel stops and the LOCOS confine charge to the channel region of width W2 existing between them. As clearly seen in FIG. 4 taken in conjunction with FIG. 1, the drawn width W2 increases to compensate for the narrowing effect of the boron implants used to create channel stops possibly resulting in the potential barriers and wells as previously discussed.

Referring again to FIG. 5, which is a top view of the present invention, a third level polysilicon (Poly3) used in fabricating the fast-dump gate (FDG) eliminates the problem of matching effective channel widths to minimize wells or barriers at exit end of the H1 cell of the horizontal charge-coupled device. It should be noted that there is no structure that is equivalent to the L2/W2 region of FIG. 1. This is an important element within the context of the present invention. The effective channel length of the third level of polysilicon FDG gate is typically on the order of a couple of microns. Its effective width is virtually infinite since it typically extends along the entire length of the HCCD. It will readily apparent to those skilled within the relevant arts that the FDG could also be formed from a different polysilicon layer as long as there are three polysilicon layers. For example, the FDG layer could be made from poly1 and the electrodes for H1 and H2 created by using poly2 and poly3 layers.

Referring to FIG. 5, there is no equivalent structure to that shown in FIG. 1 which results in the L2/W2 region as seen in FIG. 1 (i.e., W1 is constant along the entire "length" of H1), therefore there are no wells or barriers to impede charge flow during either fast-dump or HCCD-readout operation.

Figure 6A:
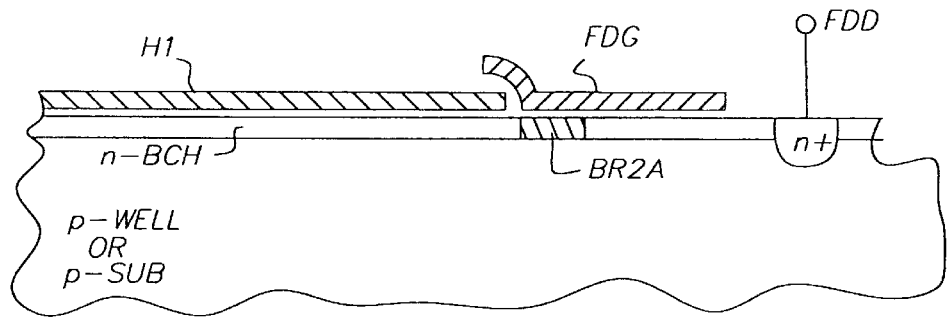
FIG. 6a is a cross-sectional view of FIG. 5 along the line AA.
Figure 6B:
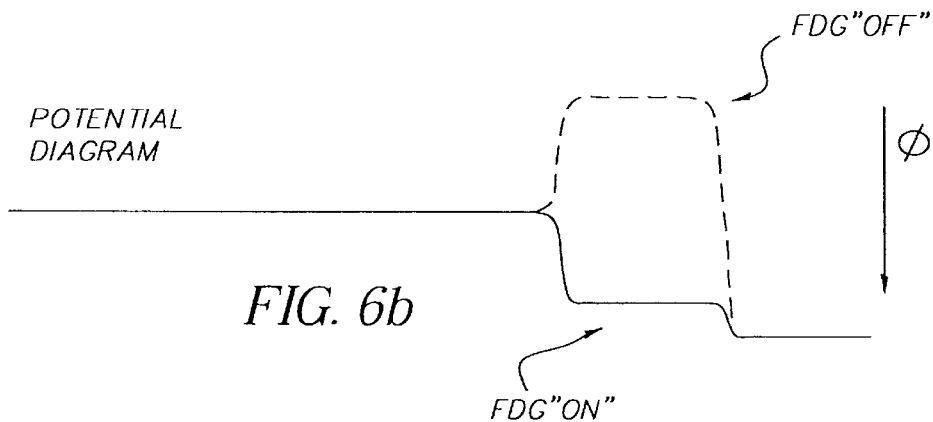
FIG. 6b is the associated potential diagram for FIG. 6a for the fast-dump gate.

Referring to FIG. 6a, which is a cross-section of FIG. 5 through line AA parallel to HCCD through the fast-dump gate (FDG) with an accompanying potential diagram as shown in FIG. 6b. The cross section shown in FIG. 6a appears similar to that shown in prior art device of FIG. 2a. Looking at the potential diagram in FIG. 6b, however, compared to those of FIG. 2b and FIG. 2c, it is readily apparent that the barriers of FIG. 2b and wells of FIG. 2c do not exist in the potential diagram seen in FIG. 6b for the present invention.

Figure 7:
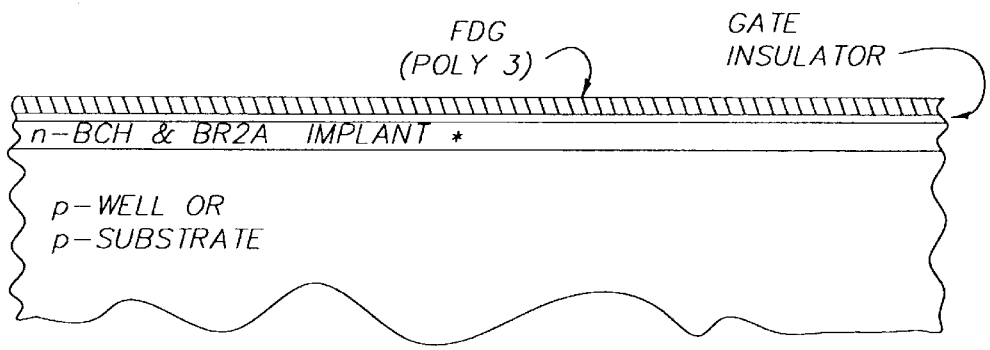
FIG. 7 is a cross-sectional view of FIG. 5 along the line BB.

This is because the present invention does not have an equivalent L2-W2 region and therefore, channel stops are not required. This (by eliminating the L2-W2 region) is how the present invention eliminates the problems of potential wells and barriers of the prior art device. The region shown in FIG. 7 is not equivalent to the L2-W2 region of the prior art. It is equivalent to the BR2A region under FDG as shown (from the top) in FIG. 1. This BR2A region under FDG of FIG. 1 is not shown in cross section by any of the drawings. There are no confining LOCOS/p+ channel stop regions in the present invention, as shown FIG. 7, since they are not necessary. Once charge enters the channel region under the FDG for the HCCD (in a fast-dump mode where the FDG would be "on"), it is destined to be drained off into the fast-dump drain, FDD. Alternatively, when the FDG is sufficiently "off" during the HCCD readout, the potential under the FDG is brought sufficiently low so as to completely isolate the charge in the HCCD from the drain. Introducing channel stops within this region would only result in the same problems developing in the prior art.

FIG. 7 is a cross section of FIG. 5 taken along line BB. For all intensive purposes, the FDG has a virtually infinite width. It should be noted, that there are no confining implants such as channel stops in prior art. A BR2A, or similar implant, is not a requirement in this region for the present invention, but may be desirable depending on the clock voltages used. That is, it was used to shift the channel potential to a more desirable level for a given clock voltage to insure that the FDG region is truly "off" relative to the potentials under the HCCD phases so that charge does not inadvertently transfer into the FDG during HCCD readout.

The invention has been described in detail with particular reference to certain preferred embodiments thereof, but it will be understood that variations and modifications can be effected within the spirit and scope of the invention.

| PARTS LIST | |
|---|---|
| BR1A | Boron doped implant |
| BR2A | Boron doped implant |
| CCD | horizontal shift register |
| H1 | first level polysilicon electrodes |
| H2 | second level polysilicon electrodes |
| FDD | fast-dump drain |
| FDG | fast-dump gate |
| HCCD | horizontal charge-coupled device |
| L2 | length |
| LOCOS | local oxidized silicon |
| n-BCH | n-type buried channel |
| Poly1 | first level of polysilicon |
| Poly2 | second level of polysilicon |
| Poly3 | third level of polysilicon |
| W1 | width |
| W2 | width |

What is claimed is:

1. A method of forming a fast-dump gate (FDG) and a fast-dump drain (FDD) on a charge coupled device having comprising the steps of:

forming a charge coupled device formed upon a substrate with at least a first level and a second level of polysilicon layers used to form a plurality of electrodes on the charge coupled device;

creating another polysilicon level to form the fast-dump gate adjacent to at least one of the electrodes of the charge coupled device; and coupling the fast-dump drain to the fast-dump gate.

2. The method of claim 1 wherein the step of creating further comprises creating the other polysilicon level such that it is separated from the electrode by an isolation material.

3. The method of claim 1 wherein the creating further comprises creating the at least one electrode with a consistent width as it approaches the another polysilicon level.

4. The method of claim 3 wherein the step of creating further comprises creating the fast-dump gate with an electrical interface between the at least one electrode and the fast-dump drain.

5. The method of claim 4 wherein the step of creating further comprises creating the electrical interface is formed without an effective resistivity change in the at least one electrode.

6. The method of claim 1 wherein the step of forming further comprises forming the fast-dump gate is formed without any channel stops beneath the another level polysilicon layer.

7. The method of claim 1 wherein the step of forming further comprises forming the other polysilicon level used to form the fast-dump gate is form in a plurality of positions along the charge coupled device.

8. The method of claim 1 wherein the step of forming the charge coupled device to form a two phase device and the another level of polysilicon is a third level of polysilicon.

9. The method of claim 1 wherein the step of forming further comprises forming without the polysilicon levels which are replaced with a different conductive material.

10. The method of claim 1 wherein the step of forming further comprises forming a buried channel of opposite conductivity from the substrate extending beneath both the charge coupled device and the fast-dump gate.

11. The method of claim 10 wherein the step of forming further comprises forming an implant of the same conductivity type as the substrate under a portion of the fast-dump gate near the at least one electrode.

* * * * *